United States Patent
Chae et al.

(10) Patent No.: US 8,947,950 B2
(45) Date of Patent: Feb. 3, 2015

(54) SEMICONDUCTOR DEVICE

(71) Applicant: Samsung Electronics Co., Ltd., Suwon-si (KR)

(72) Inventors: Kyo-Suk Chae, Suwon-si (KR); Satoru Yamada, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 53 days.

(21) Appl. No.: 13/770,150

(22) Filed: Feb. 19, 2013

(65) Prior Publication Data

US 2013/0279275 A1 Oct. 24, 2013

(30) Foreign Application Priority Data

Apr. 23, 2012 (KR) .................. 10-2012-0042177

(51) Int. Cl.
*G11C 7/00* (2006.01)
*H01L 29/78* (2006.01)
*G11C 11/4094* (2006.01)
*G11C 11/4096* (2006.01)

(52) U.S. Cl.
CPC .............. *H01L 29/7816* (2013.01); *G11C 7/00* (2013.01); *G11C 11/4094* (2013.01); *G11C 11/4096* (2013.01); *G11C 2207/005* (2013.01)
USPC ..................... 365/189.11; 365/230.06; 365/63

(58) Field of Classification Search
CPC .. G11C 7/00; G11C 11/4094; G11C 11/4096; G11C 2207/005; H01L 29/7816
USPC ........ 365/189.11, 52, 63, 194, 196, 203, 205, 365/230.06, 189.14
See application file for complete search history.

(56) References Cited

U.S. PATENT DOCUMENTS

| | | | |
|---|---|---|---|
| 5,841,717 A | 11/1998 | Yamaguchi | |
| 6,061,295 A | 5/2000 | Roh | |
| 6,172,919 B1 | 1/2001 | Horikawa | |
| 6,330,202 B1 | 12/2001 | Tanizaki et al. | |
| 6,600,688 B2 | 7/2003 | Kawabata | |
| 7,289,379 B2 | 10/2007 | Chol et al. | |
| 7,859,926 B2 | 12/2010 | Takami | |
| 2011/0032747 A1* | 2/2011 | Yoon et al. | 365/148 |
| 2011/0216577 A1* | 9/2011 | Tomotani et al. | 365/148 |
| 2012/0087198 A1* | 4/2012 | Nii et al. | 365/226 |
| 2012/0257437 A1* | 10/2012 | Seko et al. | 365/148 |

FOREIGN PATENT DOCUMENTS

| | | |
|---|---|---|
| JP | 2000-268570 | 9/2000 |
| KR | 100164386 B1 | 9/1998 |
| KR | 101999-0084623 A | 12/1999 |

\* cited by examiner

*Primary Examiner* — Gene Auduong
(74) *Attorney, Agent, or Firm* — Muir Patent Consulting, PLLC

(57) ABSTRACT

A semiconductor memory device includes a bit line connected to a memory cell; an input/output line configured to input a data signal to the memory cell during a writing operation and to output a data signal stored in the memory cell during a reading operation; and a column select transistor including a first source/drain connected to the bit line and a second source/drain connected to the input/output line, wherein a resistance of the first source/drain is smaller than a resistance of the second source/drain.

20 Claims, 15 Drawing Sheets

SEMICONDUCTOR DEVICE

CROSS-REFERENCE TO RELATED APPLICATION

This application claims the benefit of Korean Patent Application No. 10-2012-0042177, filed on Apr. 23, 2012, in the Korean Intellectual Property Office, the disclosure of which is incorporated herein in its entirety by reference.

BACKGROUND

Various example embodiments relate to a semiconductor memory device, and more particularly, to a semiconductor memory device having a column select transistor with improved operation characteristics.

A dynamic random access memory (DRAM), which is an example of semiconductor memory devices, charges data signals to a capacitor of a memory cell during a writing operation and outputs data signals stored in a capacitor of a memory cell during a reading operation. The DRAM includes an array of a plurality of memory cells, where the writing operation and the reading operation with respect to the plurality of memory cells may be performed by controlling word lines each of which is connected to memory cells arranged on a same row and bit lines each of which is connected to memory cells arranged on a same column. Operation characteristics of the reading operation and the writing operation may be affected by an operation of the column select transistor.

SUMMARY

The disclosure provides a semiconductor memory device having a column select transistor with improved operation characteristics.

According to some embodiments, there is provided a semiconductor memory device including a bit line connected to a memory cell; an input/output line configured to input a data signal to the memory cell during a writing operation and to output a data signal stored in the memory cell during a reading operation; and a column select transistor including a first source/drain connected to the bit line and a second source/drain connected to the input/output line, wherein a resistance of the first source/drain is smaller than a resistance of the second source/drain.

According to another embodiment, there is provided a semiconductor memory device including a bit line connected to a memory cell; an input/output line configured to input a data signal to the memory cell during a writing operation and to output a data signal stored in the memory cell during a reading operation; and a transistor including a first node connected to the bit line and a second node connected to the input/output line, wherein the first and second nodes are part of the transistor, and wherein a first resistance of the first node may be smaller than a second resistance of the second node.

According to another embodiment, there is provided a memory device including a bit line connected to a memory cell; an input/output line configured to write data to the memory cell during a writing operation and to read data from the memory cell during a reading operation; and a transistor having a first source/drain connected to the bit line and a second source/drain connected to the input/output line, wherein the transistor is configured such that a first current flows from the input/output line to the bit line during the writing operation, and a second current smaller than the first current flows from the bit line to the input/output line during the reading operation.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
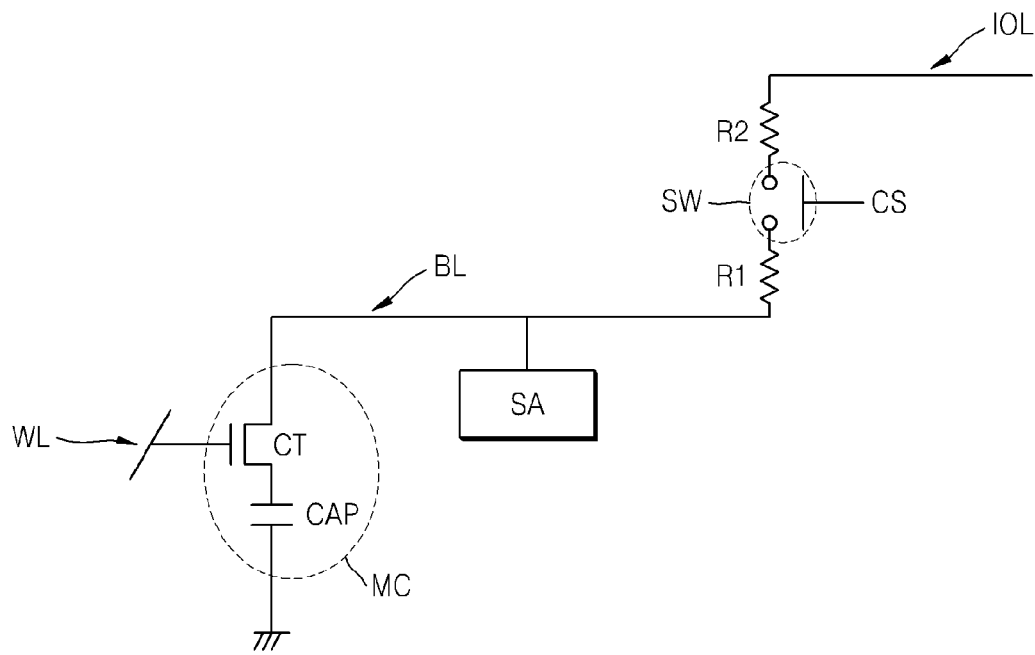
FIG. 1 is a schematic circuit diagram of a semiconductor memory device according to one embodiment.

Example embodiments of the present disclosure will now be described more fully with reference to the accompanying drawings, in which exemplary embodiments of the disclosure are shown.

The present disclosure may, however, be embodied in many alternate forms and should not be construed as being limited to the embodiments set forth herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms, such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. For example, a first element, component, region, layer or section discussed below could be termed a second element, component, region, layer or section without departing from the teachings of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The present disclosure will now be described more fully with reference to the accompanying drawings, in which exemplary embodiments are shown. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure. Expressions such as "at least one of," when preceding a list of elements, modify the entire list of elements and do not modify the individual elements of the list.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

FIG. 1 is a schematic circuit diagram of a semiconductor memory device according to one embodiment.

Referring to FIG. 1, the semiconductor memory device may include a memory cell MC, a word line WL, a bit line BL, a bit line sensing amplifier SA, an input/output line IOL, and a switching unit SW.

The memory cell MC is included in a memory array (not shown) and may be selected by the word line WL. In detail, as a row select signal decoded by an address decoder (not shown) is applied to a gate of a cell transistor CT via the word line WL, the memory cell MC may be selected. The switching unit SW connected to the selected memory cell MC may be turned on by receiving a column select signal CS, and, as the switching unit SW is turned on, a writing operation or a reading operation may be performed.

During a writing operation, a data signal may be input to the memory cell MC. In more detail, the switching unit SW may be turned on by the column select signal CS, and thus a data signal may be transmitted to the bit line BL. As the cell transistor CT is turned on by a row select signal, the bit line BL and a capacitor CAP are electrically connected to each other, and the data signal may be stored in the capacitor CAP.

During a reading operation, a data signal stored in the memory cell MC may be output. In more detail, as the cell transistor CT is turned on by a row select signal, a data signal stored in the capacitor CAP may be transmitted to the bit line BL. The data signal is amplified by the bit line sensing amplifier SA and may be transmitted to the input/output line IOL via the switching unit SW connected to the bit line BL.

The switching unit SW is interposed between the bit line BL and the input/output line IOL and may be configured to receive the column select signal CS and electrically interconnect the bit line BL and the input/output line IOL. A first resistance R1 between the switching unit SW and the bit line BL and a second resistance R2 between the switching unit SW and the input/output line IOL may be different from each other. For example, the first resistance R1 may be lower than the second resistance R2, and the switching unit SW may be configured such that a first current flows during a writing operation and may be configured such that a second current, which is smaller than the first current, flows during a reading operation. The first resistance R1 and the second resistance R2 may be parts of the switching unit SW. For example, the first resistance and second resistance may be resistances of the doped source and drain regions of the switching unit SW, as opposed to resistances of conductive lines connected to the switching unit SW.

Although FIG. 1 shows that the memory cell MC is a DRAM (dynamic random access memory) memory cell MC including the cell transistor CT and the capacitor CAP, the disclosure is not limited thereto. For example, the memory cell MC may be a volatile memory cell MC, such as a SRAM, a resistive memory cell MC, such as a phase-change RAM (PRAM) and a resistive RAM (RRAM), a nano floating gate memory (NFGM) memory cell MC, a polymer RAM (PoRAM) memory cell MC, a magnetic RAM MRAM) memory cell MC, a ferroelectric RAM (FeRAM) memory cell MC, or a flash memory cell MC.

Figure 2:
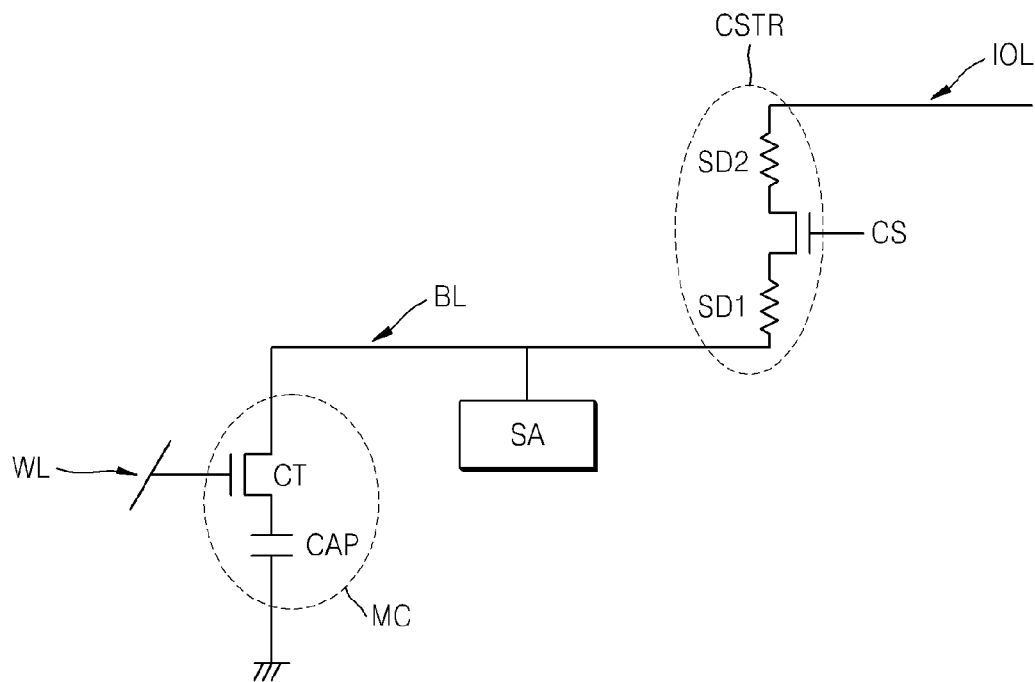
FIG. 2 is a schematic circuit diagram of a semiconductor memory device according to one embodiment.

FIG. 2 is a circuit diagram of a semiconductor memory device according to one embodiment.

Referring to FIG. 2, the semiconductor memory device may include a memory cell MC, a word line WL, a bit line BL, a bit line sensing amplifier SA, an input/output line IOL, and a column select transistor CSTR. Since the memory cell MC, the word line WL, the bit line BL, the bit line sensing amplifier SA, and the input/output line IOL are identical to those shown in FIG. 1, detailed descriptions thereof will be omitted.

The column select transistor CSTR may include a gate for receiving a column select signal CS, first source/drain SD1 connected to the bit line BL, and second source/drain SD2 connected to the input/output line IOL. As described above with reference to FIG. 1, a first resistance (R1 of FIG. 1) between the column select transistor CSTR and the bit line BL (e.g., resistance of the first source/drain SD1) and a second resistance (R2 of FIG. 1) between the column select transistor CSTR and the input/output line IOL (e.g., resistance of the second source/drain SD2) may be different from each other. In other words, the first source/drain SD1 and the second source/drain SD2 may have asymmetrical resistances each other.

In more detail, the resistance of the first source/drain SD1 may be lower than the resistance of the second source/drain SD2. During a writing operation, the first source/drain SD1 with relatively low resistance may function as a source terminal of the column select transistor CSTR, whereas the second source/drain SD2 with relatively high resistance may function as a drain terminal of the column select transistor CSTR. Therefore, because of this resistance configuration, during a writing operation, the column select transistor CSTR may cause a relatively large first current to flow. As such, the writing operation may be improved. On the contrary, during a reading operation, the first source/drain SD1 may function as a drain terminal of the column select transistor CSTR, whereas the second source/drain SD2 may function as a source terminal of the column select transistor CSTR. Therefore, during a reading operation, the column select transistor CSTR may cause a relatively small second current to flow. During a reading operation, the relatively high resistance of the second source/drain SD2 may prevent a charge current from flowing in the input/output line IOL so that the reading operation may be improved.

The column select transistor CSTR may be configured such that the first current flows during a writing operation and may be configured such that the second current, which is smaller than the first current, flows during a reading operation. As a result, operation characteristics of the column select transistor CSTR may be improved.

Figure 3:
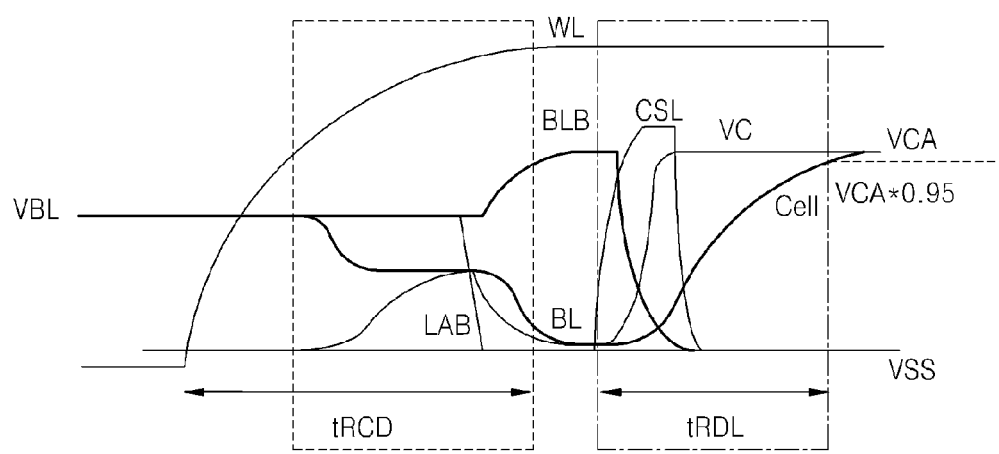
FIG. 3 is a graph showing tRCD, which is the operation characteristic of the semiconductor memory device of FIG. 2 during a reading operation, and tRDL, which is the operation characteristic of the semiconductor memory device of FIG. 2 during a writing operation according to certain embodiments.
Figure 4:
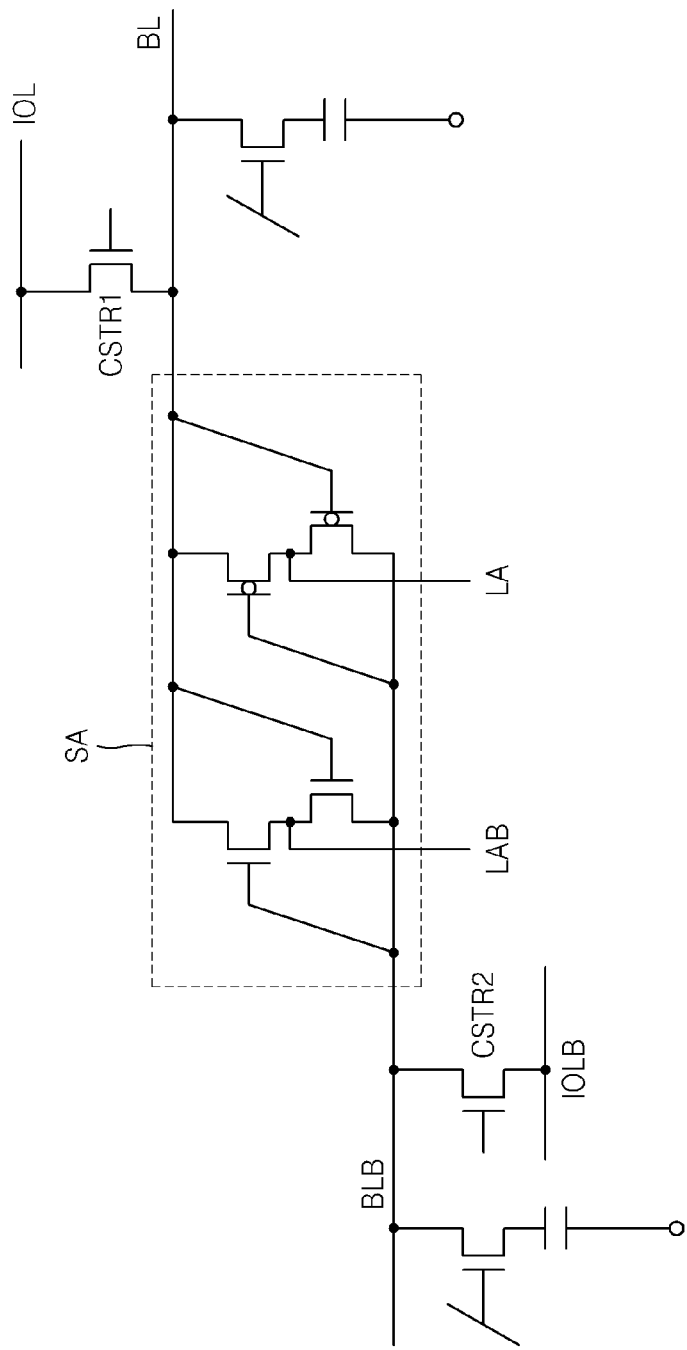
FIG. 4 is a diagram showing an exemplary semiconductor memory device including a plurality of column select transistors, according to one embodiment.
Figure 5:
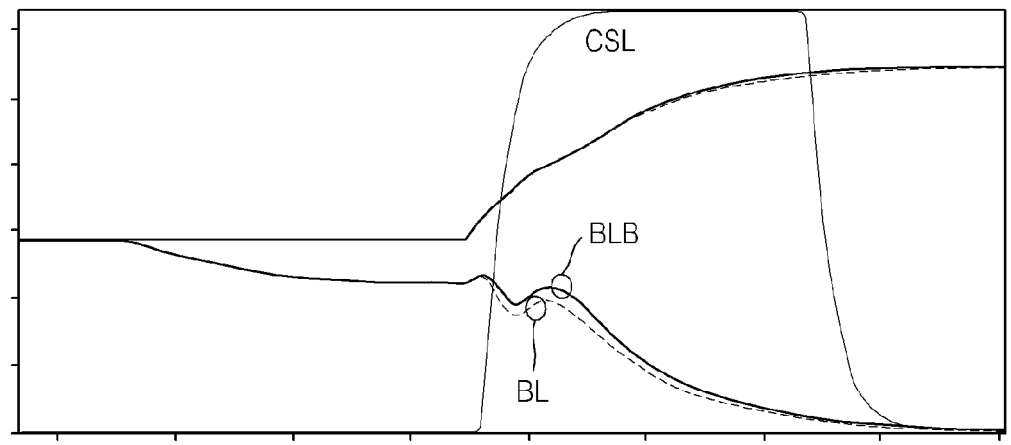
FIG. 5 is a graph showing changes of voltage levels at a bit line and a bit line bar during an exemplary reading operation with respect to the semiconductor memory device of FIG. 4.

FIG. 3 is a graph showing tRCD, which is an exemplary operation characteristic of the semiconductor memory device of FIG. 2 during a reading operation, and tRDL, which is the operation characteristic of the semiconductor memory device of FIG. 2 during a writing operation according to certain embodiments. FIG. 4 is a diagram showing an exemplary semiconductor memory device including a plurality of column select transistors, according to one embodiment, and FIG. 5 is a graph showing changes of voltage levels at a bit line and a bit line bar during an exemplary reading operation with respect to the semiconductor memory device of FIG. 4.

Referring to FIGS. 2 and 3, tRCD may be defined as a period of time during which a row select signal that is applied to the word line WL is enabled, a data signal is amplified/sensed, the column select transistor CSTR is turned on, and the data signal is transmitted via the input/output line IOL (e.g., from a time of a word line WL enabling to a time point of a predetermined Δ VBL, for example, 300 mv). Furthermore, tRDL may be defined as a period of time elapsed until sufficient (e.g., 95% of the entire capacity of the capacitor CAP of the memory cell MC) data signals (e.g., charges) are stored in the capacitor CAP of the memory cell MC after the column select transistor CSTR is turned on.

Generally, to improve a writing characteristic (e.g., to reduce tRDL), it is necessary to increase operation current of the column select transistor CSTR, and operation current of the column select transistor CSTR may be increased by increasing capacity of the column select transistor CSTR (e.g., channel width). However, if capacity of the column select transistor CSTR increases, a reading characteristic may be deteriorated.

For example, if the column select transistor CSTR is turned on for performing a reading operation, charges are introduced from an external capacitive portion like a parasitic capacitance, where the introduction of the charges may cause bit line disturbance in which data signals are incorrectly sensed. The bit line disturbance may become more significant as operation current of the column select transistor CSTR increases due to increased capacity of the column select transistor CSTR.

Referring to FIGS. 4 and 5, if a reading operation is performed by a first column select transistor CSTR1 having a relatively small capacity, change of voltage level of a bit line due to introduction of charges may be relatively small, and thus a margin for preventing bit line disturbance may be improved. However, if a reading operation is performed by a second column select transistor CSTR2 having a relatively large capacity, change of voltage level of a bit line due to introduction of charges may be relatively large, and thus a necessary margin for preventing bit line disturbance may not be secured Therefore, if capacity of a column select transistor is increased, although a writing characteristic is improved, a sufficient margin for preventing bit line disturbance may not be secured, and thus the overall operation characteristics of the semiconductor memory device may be deteriorated.

However, a column select transistor according to example embodiments may be configured such that the first operation current flows during a writing operation and the second operation current flows during a reading operation. Therefore, even if capacity of the column select transistor is increased for improved writing characteristic, current flowing during a reading operation may be maintained or reduced, and thus a margin for preventing bit line disturbance may be improved. As a result, the overall operation characteristics of the semiconductor memory device may be improved.

Figure 6:
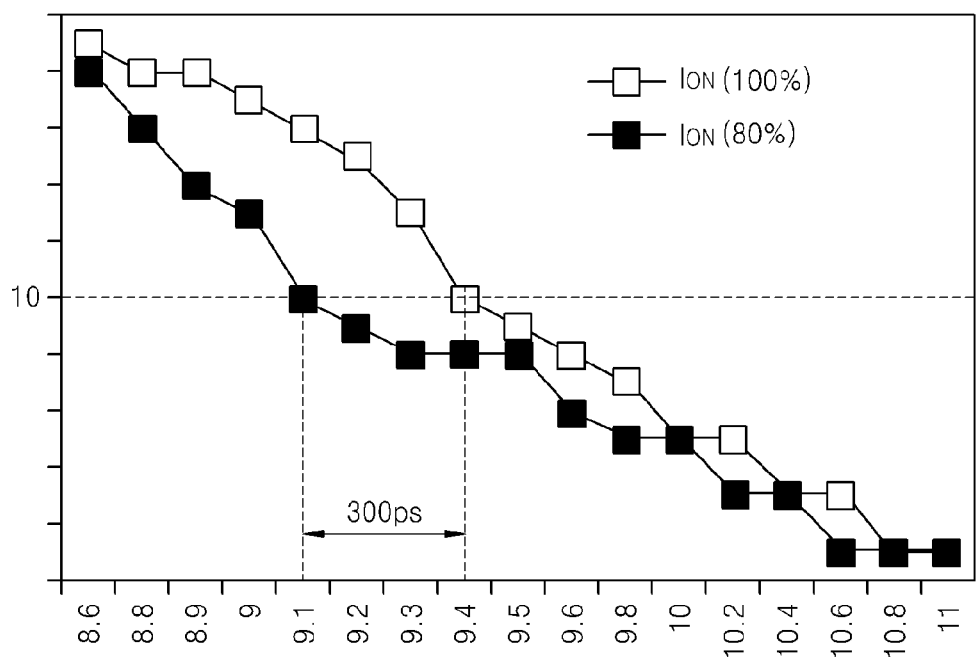
FIG. 6 is a graph showing exemplary operation characteristics of semiconductor memory devices according to one embodiment.

FIG. 6 is a graph showing exemplary operation characteristics of a semiconductor memory device according to one embodiment, and more particularly, is a Monte simulation graph which shows the number of failed memory cells according to change of tRCD.

As described above, a semiconductor memory device according to one embodiment may include a column select transistor configured such that the first operation current flows during a writing operation and the second operation current smaller than the first operation current flows during a reading operation.

Referring to FIG. 6, in case of a column select transistor with 100% ratio (that is, a ratio of the second operation current with respect to the first operation current is 100%) in the related art, it is necessary to maintain tRCD at about 9.45 ns to maintain failure of memory cells of 10 absolute units (AU).

However, a column select transistor of a semiconductor memory device according to some embodiments may have a ratio less than 100% (that is, a ratio of the second operation current with respect to the first operation current is less than 100%). For example, according to a certain embodiment, a column select transistor with 80% ratio (that is, a ratio of the second operation current with respect to the first operation current is 80%) may be embodied. In this case, tRCD may be improved for maintaining failure of memory cells of 10 AU as shown in FIG. 6.

As a result, even if capacity of a column select transistor is increased for improved writing characteristic, a sufficient margin (e.g., 300 ps) for preventing bit line disturbance in a reading operation may be secured, and thus the overall operation characteristics of the semiconductor memory device may be improved.

Figure 7:
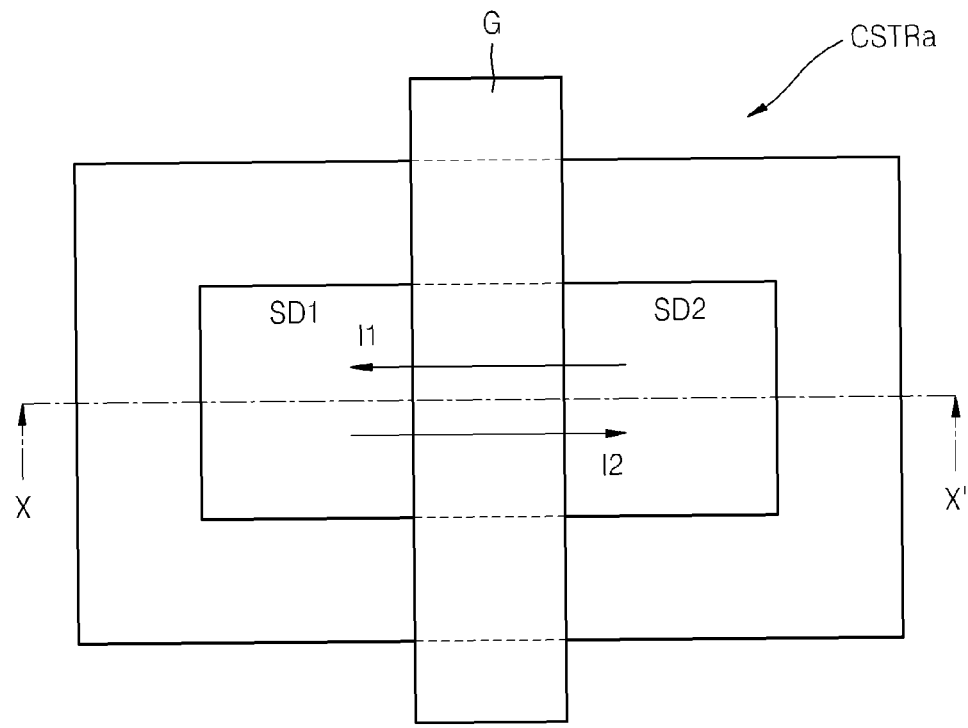
FIG. 7 is a schematic plan view of a column select transistor in a semiconductor memory device according to one embodiment.
Figure 8:
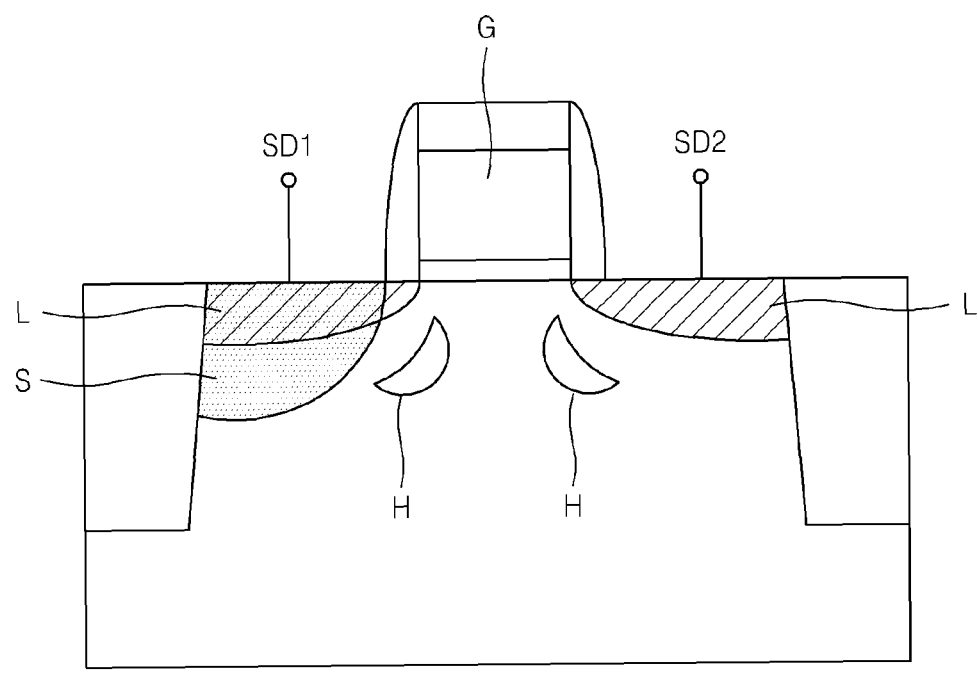
FIGS. 8 through 10 are exemplary cross-sectional views of the semiconductor device taken along a line X-X' of FIG. 7 according to certain embodiments.
Figure 9:
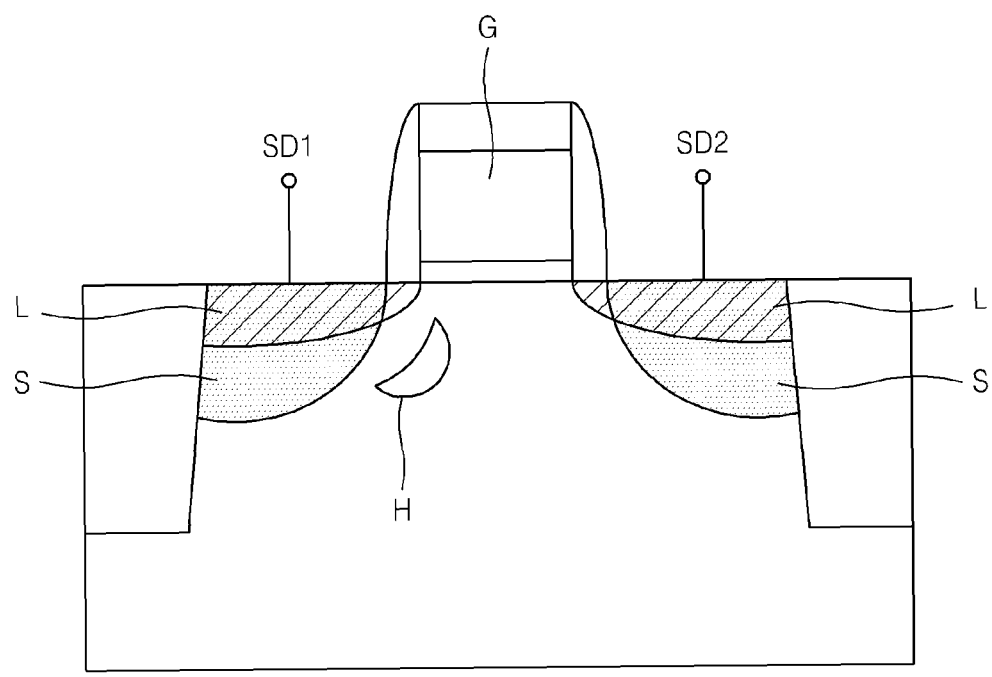
Figure 10:
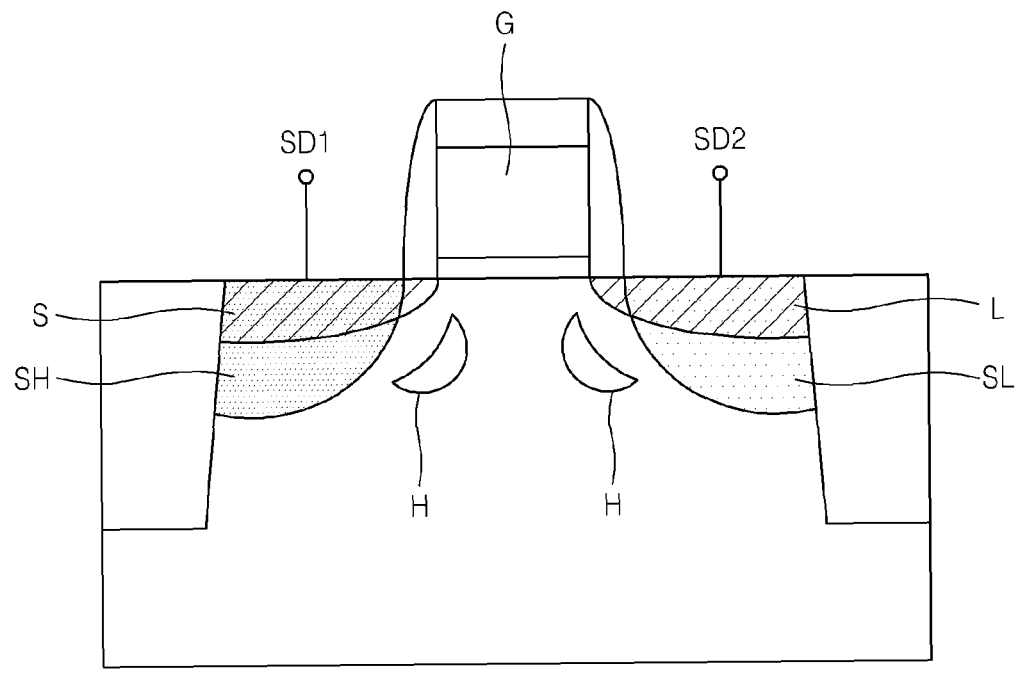

FIG. 7 is a schematic plan view of a column select transistor CSTRa in a semiconductor memory device according to one embodiment. FIGS. 8 through 10 are exemplary cross-sectional views of the semiconductor device taken along a line X-X' of FIG. 7 according to certain embodiments.

Referring to FIG. 7, the column select transistor CSTRa may include a gate G, the first source/drain SD1, and the second source/drain SD2.

The first source/drain SD1 (that is, source/drain connected to the bit line (BL of FIG. 2)) and the second source/drain SD2 (that is, source/drain connected to the input/output line (IOL of FIG. 2)) may have asymmetrical resistances. In detail, doping concentration of the first source/drain SD1 may be higher than that of the second source/drain SD2, and thus resistance of the first source/drain SD1 may be lower than that of the second source/drain SD2.

In the column select transistor CSTRa, a source and a drain are switched during a writing operation and a reading operation. For example, the first source/drain SD1 may function as the source terminal of the column select transistor CSTRa and the second source/drain SD2 may function as the drain terminal of the column select transistor CSTRa during a writing operation. Furthermore, the first source/drain SD1 may function as a drain terminal of the column select transistor CSTRa and the second source/drain SD2 may function as a source terminal of the column select transistor CSTRa during a reading operation.

A semiconductor memory device according to one embodiment includes the column select transistor CSTRa in which the first source/drain SD1 having a relatively small resistance functions as the source terminal and the second source/drain SD2 having a relatively large resistance functions as the drain terminal during a writing operation. Therefore, during a writing operation, a relatively large first operation current I1 may flow from the second source/drain SD2 to the first source/drain SD1.

Furthermore, a semiconductor memory device according to one embodiment includes the column select transistor CSTRa in which the second source/drain SD2 having a relatively large resistance functions as the source terminal and the first source/drain SD 1 having a relatively small resistance functions as the drain terminal during a reading operation. Therefore, during a reading operation, a relatively small second operation current I2 may flow from the first source/drain SD1 to the second source/drain SD2.

The first source/drain SD1 may include M regions selected from among a lightly doped drain (LDD) region, a halo doped region, and a source/drain doped region, whereas the second source/drain SD2 may include N regions selected from among a LDD region, a halo doped region, and a source/drain doped region. For example, M may be greater than N.

For example, doping concentrations may be combined as shown in Table 1 below. In Table 1, O indicates that a corresponding implant is doped, whereas X indicates that a corresponding implant is not doped.

TABLE 1

| | First Source/Drain SD1 | | | Second Source/Drain SD2 | | |
|---|---|---|---|---|---|---|
| Case | LDD Region | Halo Doped Region | Source/Drain Doped Region | LDD Region | Halo Doped Region | Source/Drain Doped Region |
| 1 | O | O | O | O | O | X |
| 2 | O | O | O | X | O | O |
| 3 | O | O | O | O | X | O |
| 4 | O | O | X | O | X | X |
| 5 | O | O | X | X | O | X |
| 6 | X | O | O | X | O | X |
| 7 | X | O | O | X | X | O |
| 8 | O | X | O | O | X | X |
| 9 | O | X | O | X | X | O |

For example, as shown in FIG. 8, the first source/drain SD 1 may include three regions, that is, a LDD region L, a halo doped region H, and a source/drain doped region S, whereas the second source/drain SD2 may include two regions, that is, a LDD region L and a halo doped region H. This case corresponds to the case 1 of Table 1.

Furthermore, as shown in FIG. 9, the first source/drain SD1 may include three regions, that is, a LDD region L, a halo doped region H, and a source/drain doped region S, whereas the second source/drain SD2 may include two regions, that is, a LDD region L and a source/drain doped region S. This case corresponds to the case 3 of Table 1.

Although column select transistors in which the first source/drain SD1 has a higher doping concentration than that of the second source/drain SD2, through FIG. 8 and FIG. 9, the disclosure is not limited thereto. For example, any of various combinations of implants as shown in Table 1 may be used. Furthermore, as shown in Table 2, by forming a particular doped region (e.g., the source/drain doped region S) to have an asymmetrical impurity concentration, the column select transistor CSTRa in which the first source/drain SD1 has a higher doping concentration than that of the second source/drain SD2 may be embodied.

TABLE 2

| | First Source/Drain SD1 (Highly doped Source/Drain Region) | | Second Source/Drain SD2 (Lightly Doped Source/Drain Region) | |
|---|---|---|---|---|
| Case | LDD Region | Halo Doped Region | LDD Region | Halo Doped Region |
| 1 | O | O | O | O |
| 2 | O | O | X | O |
| 3 | O | O | O | X |
| 4 | O | X | O | X |
| 5 | X | O | X | O |

As shown in Table 2, the first source/drain SD1 includes the highly doped source/drain region S and M regions selected from the LDD region and the halo doped region, whereas the second source/drain SD2 includes the lightly doped source/drain region S and N regions selected from the LDD region and the halo doped region. In this case, M may be equal to or greater than N.

For example, as shown in FIG. 10, both the first source/drain SD1 and the second source/drain SD2 of a column select transistor may include 3 regions including the LDD region L, the halo doped region H, and the source/drain doped region S, where a highly doped source/drain region SH may be formed in the first source/drain SD 1 and a lightly doped source/drain region SL may be formed in the second source/drain SD2. This case corresponds to the case 1 of Table 2.

Although various embodiments are shown in Table 2 under an assumption that a highly doped source/drain region SH is formed in the first source/drain SD1 and a lightly doped source/drain region SL is formed in the second source/drain SD2, the disclosure is not limited thereto. For example, a highly doped LDD region may be formed in the first source/drain SD1 and a lightly doped LDD region may be formed in the second source/drain SD2. Alternatively, a highly doped halo region may be formed in the first source/drain SD1 and a lightly doped halo region may be formed in the second source/drain SD2.

Figure 11:
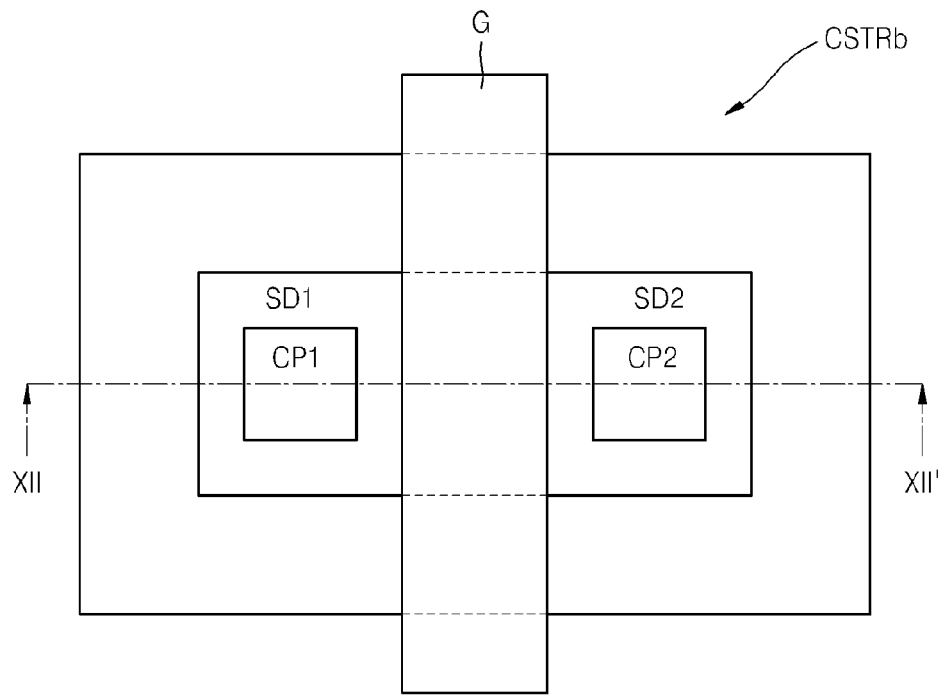
FIG. 11 is a schematic plan view of a column select transistor in a semiconductor device according to another embodiment.
Figure 12:
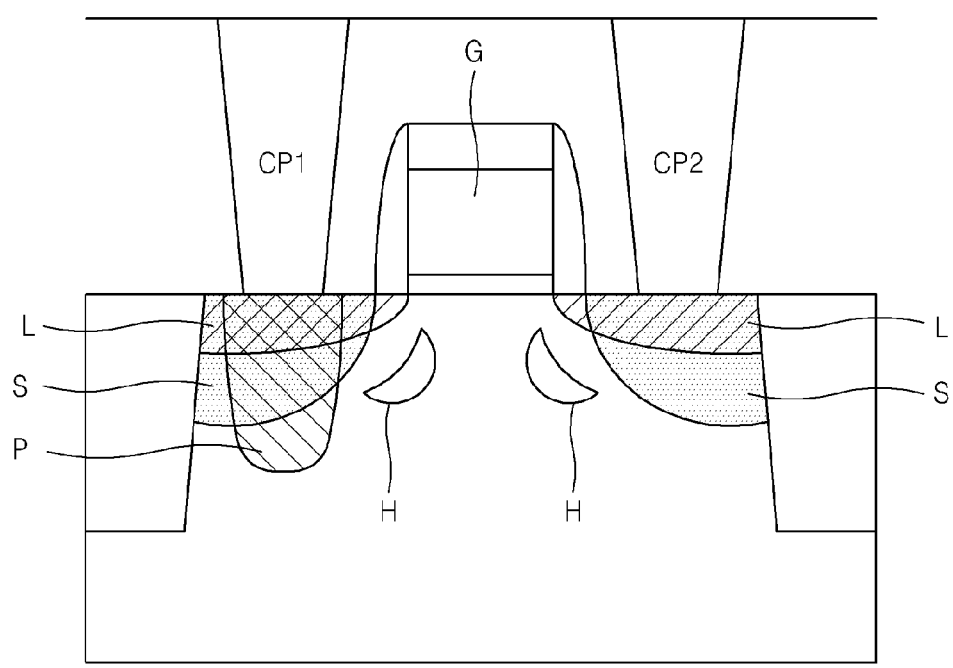
FIG. 12 is an exemplary cross-sectional view of the semiconductor device taken along a line XII-XII' of FIG. 11 according to certain embodiments.

FIG. 11 is a schematic plan view of a column select transistor CSTRb in a semiconductor device according to another embodiment. FIG. 12 is an exemplary sectional view of the semiconductor device of FIG. 11 according to certain embodiments, taken along a line XII-XII'.

Referring to FIGS. 11 and 12, as described above with reference to FIG. 8, the column select transistor CSTRb may be configured, such that the first source/drain SD1 with relatively low resistance functions as a source terminal and the second source/drain SD2 with relatively high resistance functions as a drain terminal, during a writing operation. In other words, in the column select transistor CSTRb, resistance of the first source/drain SD1 may be lower than that of the second source/drain SD2, and doping concentration first source/drain SD1 may be higher than that of the second source/drain SD2.

For example, both the first source/drain SD1 and the second source/drain SD2 may be formed to contain three regions, that is, the LDD region L, the halo doped region H, and the source/drain doped region S.

Next, a first contact plug CP1 interconnecting the first source/drain SD1 and the bit line (BL of FIG. 2) and a second contact plug CP2 interconnecting the second source/drain SD2 and the input/output line (IOL of FIG. 2) may be formed. Before the first contact plug CP1 and the second contact plug CP2 are formed, a highly doped plug doping region P for reducing resistance between the first contact plug CP1 and the column select transistor CSTRb may be formed in the first source/drain SD1.

On the contrary, a lightly doped plug doping region (not shown) may be formed in the second source/drain SD2 or, as shown in FIG. 12, no plug doping region may be formed in the second source/drain SD2. As a result, a first resistance (e.g., resistance of the first source/drain SD1) between the column select transistor CSTRb and the bit line (BL of FIG. 2) may be lower than a second resistance (e.g., resistance of the second source/drain SD2) between the column select transistor CSTRb and the input/output line (IOL of FIG. 2).

Figure 13:
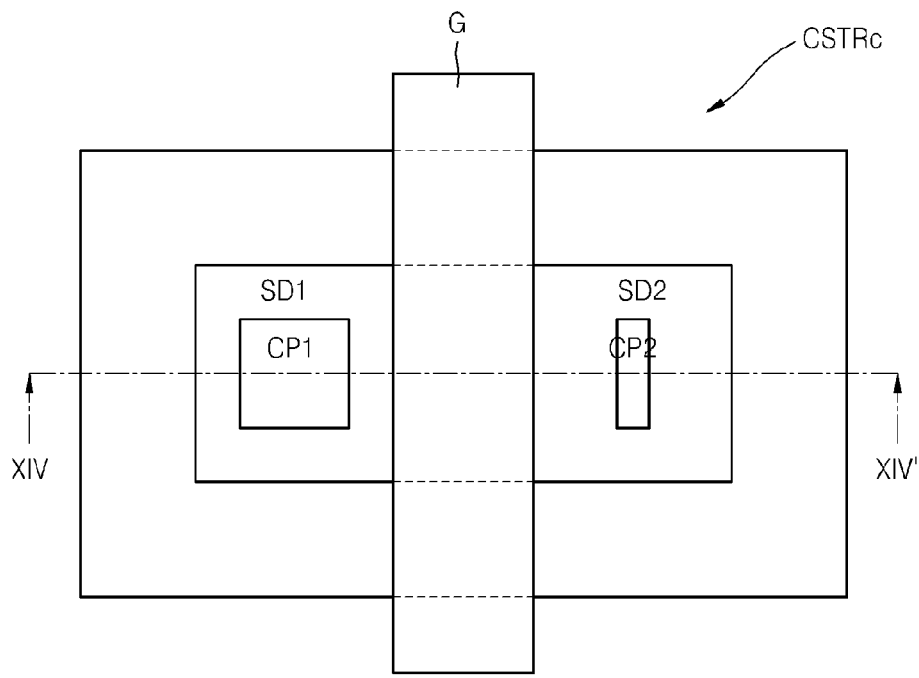
FIG. 13 is a schematic plan view of a column select transistor in a semiconductor memory device according to another embodiment.
Figure 14:
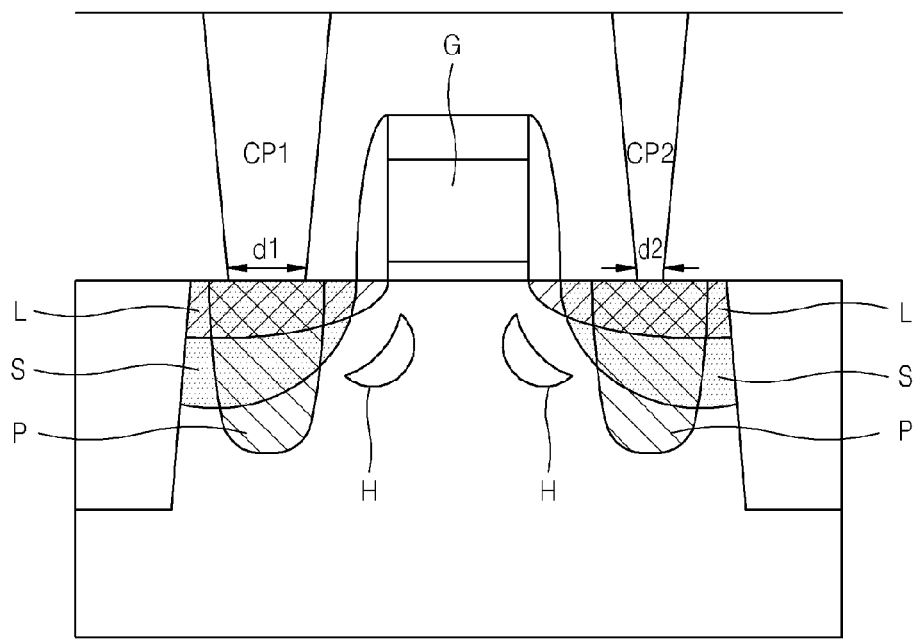
FIG. 14 is an exemplary cross-sectional view, taken along a line XIV-XIV' of FIG. 13 according to certain embodiments.
Figure 15:
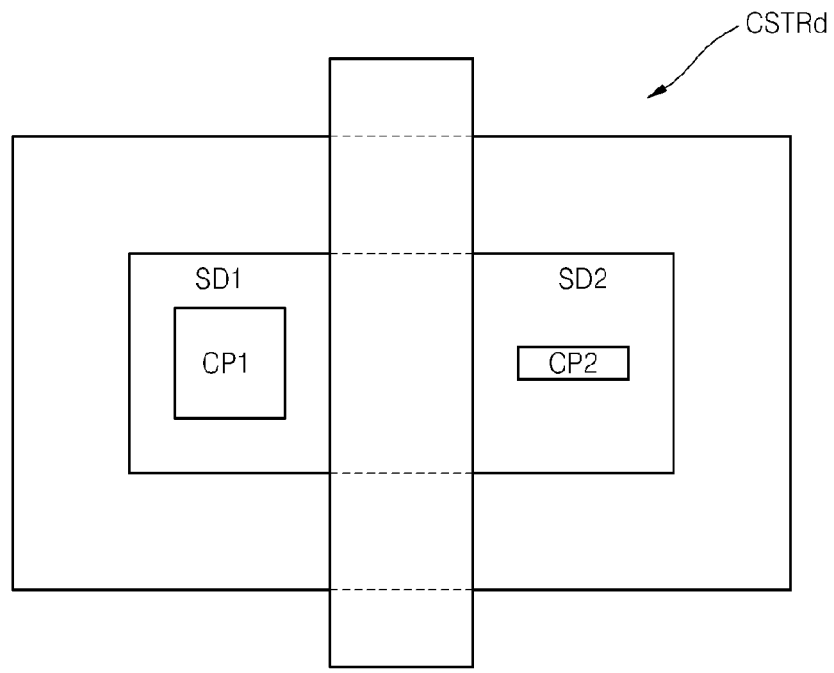
FIGS. 15 and 16 are schematic plan views of column selector transistors in semiconductor devices according to other embodiments, respectively.
Figure 16:
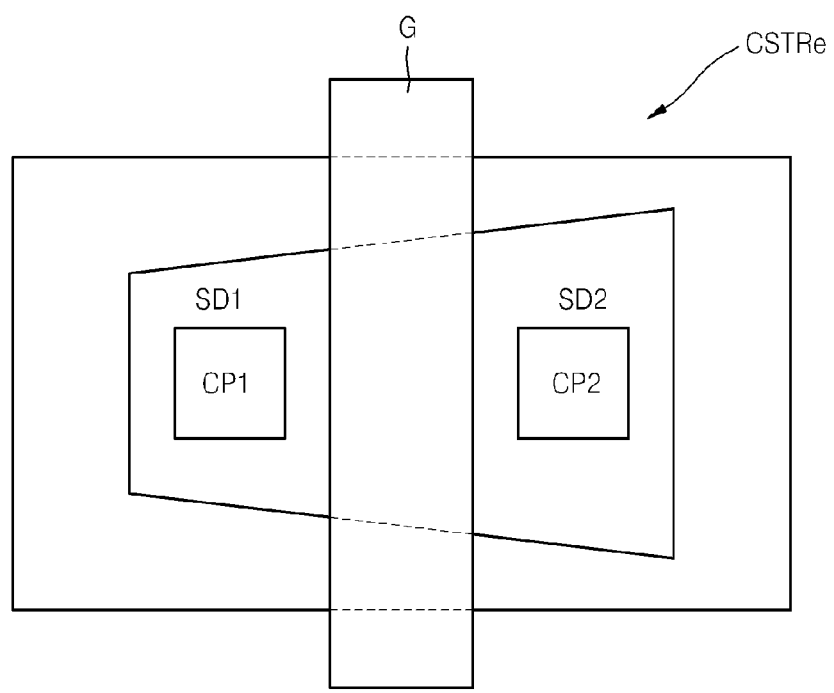

FIG. 13 is a schematic plan view of a column select transistor CSTRc in a semiconductor memory device according to another embodiment. FIG. 14 is an exemplary sectional view, taken along a line XIV-XIV' of FIG. 13 according to certain embodiments. FIGS. 15 and 16 are schematic plan views of column selector transistors CSTRd and CSTRe in semiconductor devices according to other embodiments, respectively.

The semiconductor memory devices according to the embodiments shown in FIGS. 13 through 16 may be modifications of the semiconductor memory device shown in FIG. 11. Hereinafter, any repeated descriptions will be omitted.

According to results of experiments, operation current of a transistor tends to decrease as an occupying ratio of a contact plug with respect to source/drain decreases. Based on the tendency, the disclosed embodiments may provide a column select transistor in which the first operation current (I1 of FIG. 7) flows during a writing operation and the second operation current (I2 of FIG. 7), which is smaller than the first operation current, flows during a reading operation. In detail, a column select transistor may be formed, such that a first occupying ratio of the second contact plug CP2 with respect to the second source/drain SD2 is smaller than a second occupying ratio of the first contact plug CP1 with respect to the first source/drain SD 1.

Referring to FIGS. 13 through 16, to form column select transistors CSTRd and CSTRe in which a first occupying ratio of the second contact plug CP2 with respect to the second source/drain SD2 is smaller than a second occupying ratio of the first contact plug CP1 with respect to the first source/drain SD 1, the second contact plug CP2 may be formed to have larger area than the first contact plug CP1. Since resistance of a conductor is inversely proportional to area of the conductor, resistance increases as area decreases. Therefore, by reducing area of the second contact plug CP2, resistance of the second source/drain SD2 may become higher than that of the first source/drain SD1. For example, as shown in FIG. 14, the first source/drain SD1 may be formed to have a first width d1, whereas the second source/drain SD2 may be formed to have a second width d2, which is smaller than the first width d1.

Furthermore, referring to FIG. 16, to form the column select transistor CSTRe in which the second occupying ratio of the second contact plug CP2 is smaller than the first occupying ratio of the first contact plug CP1, the first source/drain SD1 may be formed to have a smaller area than the second source/drain SD2. Since an area of the second source/drain SD2 is larger than that of the first source/drain SD1, the second occupying ratio of the second contact plug CP2 with respect to the second source/drain SD2 becomes smaller than the first occupying ratio of the first contact plug CP1 with respect to the first source/drain SD1. Therefore, the column select transistor CSTRe may be configured such that a first current flows during a writing operation and a second current, which is larger than the first current, flows during a reading operation. Although the second source/drain SD2 of FIG. 16 has a diamond shape, it may have other shapes, such as a rectangular shape or a square shape.

Figure 17:
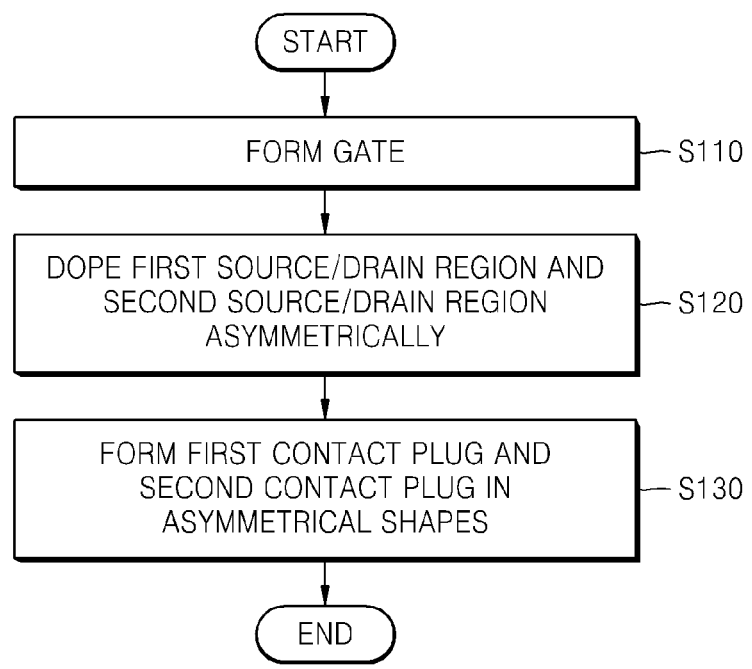
FIG. 17 is a schematic flowchart showing a method of fabricating a semiconductor memory device according to one embodiment.

FIG. 17 is a schematic flowchart showing a method of fabricating a semiconductor memory device according to one embodiment.

Referring to FIG. 17, the method of fabricating a semiconductor memory device may include a first operation S110 for forming a gate on an active region, a second operation S120 for performing an asymmetrical doping process on first source/drain regions and second source/drain regions, and a third operation S130 for forming a first contact plug and a second contact plug in an asymmetrical shape.

Although FIG. 17 shows a case in which the second operation 5120 and the third operation S130 are successively performed, the disclosure is not limited thereto. For example, by performing at least one of the second operation S120 and the third operation S130, a semiconductor memory device having an asymmetrical column select transistor in which a first resistance of a first source/drain connected to a bit line BL differs from a second resistance of a second source/drain connected to an input/output line IOL may be formed.

For example, as shown in FIGS. 8 through 10 and 12, after the second operation 120 for performing an asymmetrical doping process on first source/drain regions and second source/drain regions is performed, a first contact plug and a second contact plug may be formed in a symmetrical shape. Furthermore, as shown in FIG. 14, before the third operation S130 for forming a first contact plug and a second contact plug in an asymmetrical shape is performed, a symmetrical doping process may be performed on first source/drain regions and second source/drain regions.

Figure 18:
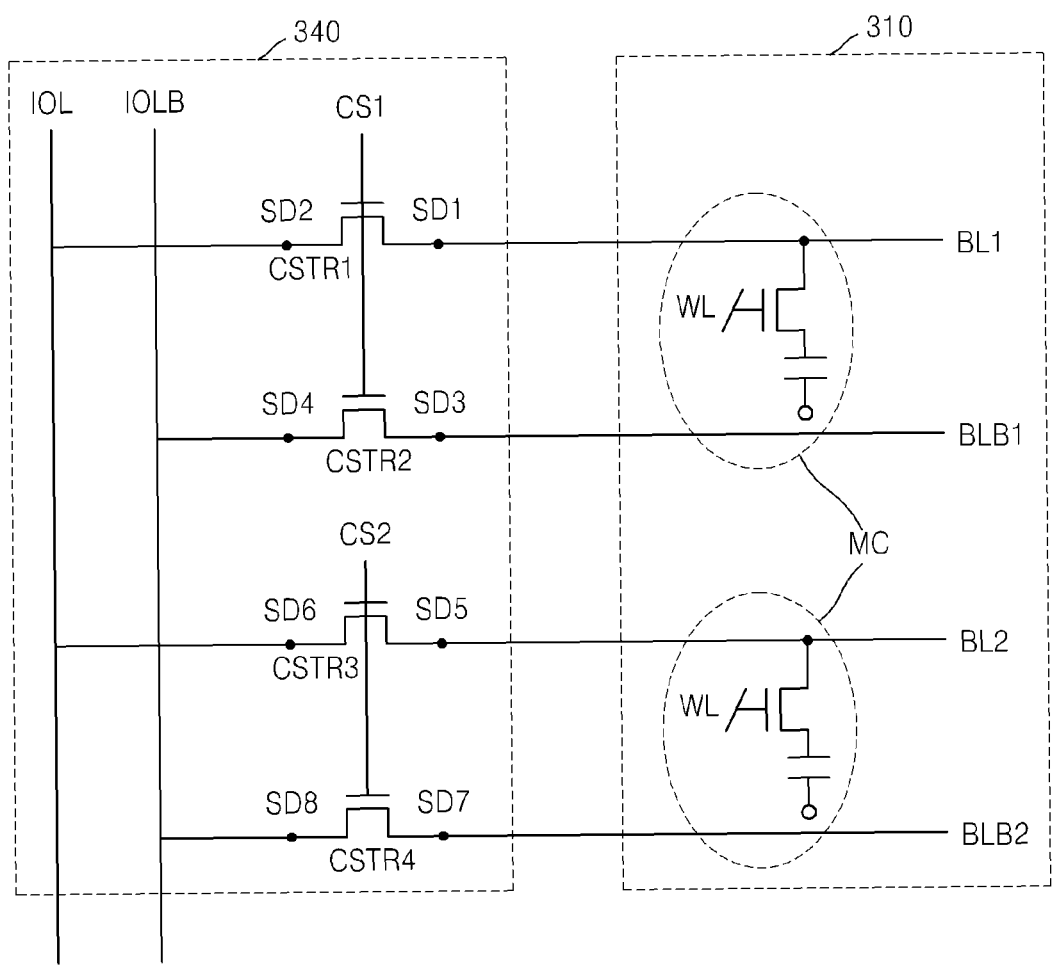
FIG. 18 is a schematic circuit diagram of a semiconductor memory device according to another embodiment.

FIG. 18 is a schematic circuit diagram of a semiconductor memory device according to another embodiment.

Referring to FIG. 18, the semiconductor memory device may include a memory array 310 and an input/output circuit 340. As described above, the memory array 310 may include the plurality of memory cells MC, in the same manner as that of FIG. 1, and thus any repeated descriptions will be omitted below.

The input/output circuit 340 may include a first column select transistor CSTR1, a second column select transistor CSTR2, a third column select transistor CSTR3, and a fourth column select transistor CSTR4.

The first column select transistor CSTR1 may include a first gate for receiving a first column select signal CS1, the first source/drain SD1 connected to the first bit line BL1, and the second source/drain SD2 connected to the input/output line IOL.

The second column select transistor CSTR2 may include a second gate for receiving the first column select signal CS1, a third source/drain SD3 connected to a first bit line bar BLB1, and a fourth source/drain SD4 connected to an input/output line bar IOLB.

The third column select transistor CSTR3 may include a third gate for receiving a second column select signal CS2, a fifth source/drain SD5 connected to a second bit line BL2, and a sixth source/drain SD6 connected to an input/output line IOL.

The fourth column select transistor CSTR4 may include a fourth gate for receiving a second column select signal CS2, a seventh source/drain SD7 connected to a second bit line bar BLB2, and an eighth source/drain SD8 connected to the input/output line bar IOLB.

The first source/drain SD1 and the second source/drain SD2 of the first column select transistor CSTR1 may have asymmetrical resistances. In the same regard, each of the second column select transistor CSTR2, the third column select transistor CSTR3, and the fourth column select transistor CSTR4 may include a pair of source/drains having asymmetrical resistances.

Figure 19:
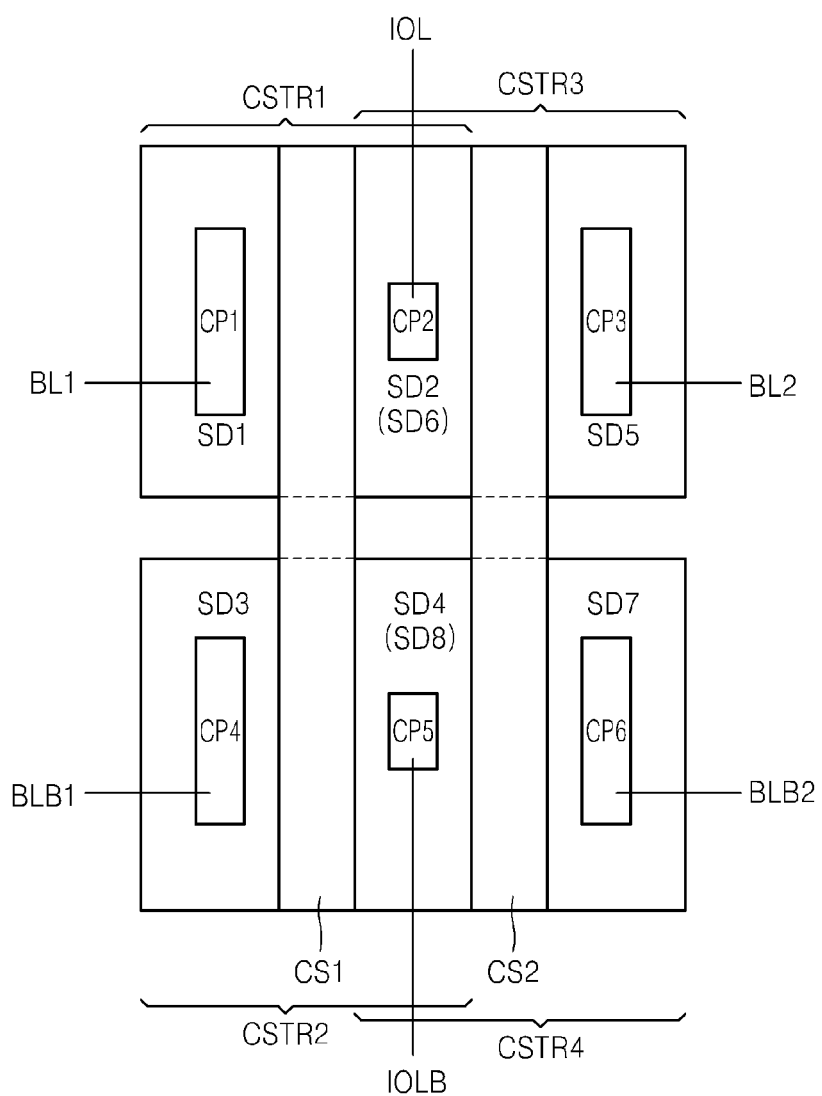
FIG. 19 is a schematic plan view of an input/output circuit of the semiconductor memory device of FIG. 18 according to certain embodiments.

FIG. 19 is a schematic plan view of an input/output circuit of the semiconductor memory device of FIG. 18 according to certain embodiments.

Referring to FIG. 19, contact plugs having asymmetrical shapes may be formed to form a column select transistor including a pair of source/drain having asymmetrical resistances.

For example, the first source/drain SD1 of the first column select transistor CSTR1 may be connected to the first bit line BL1 via the first contact plug CP1, wherein the second source/drain SD2 of the first column select transistor CSTR1 may be connected to the input/output line IOL via the second contact plug CP2 smaller than the first contact plug CP1.

The sixth source/drain SD6 of the third column select transistor CSTR3 may be formed in a same region in which the second source/drain SD2 of the first column select transistor CSTR1 is formed. Therefore, the fifth source/drain SD5 of the third column select transistor CSTR3 may be connected to the second bit line BL2 via a third contact plug CP3, whereas the sixth source/drain SD6 of the third column select transistor CSTR3 may be connected to the input/output line IOL via the second contact plug CP2 smaller than the third contact plug CP3.

Furthermore, the third source/drain SD3 of the second column select transistor CSTR2 may be connected to the first bit line bar BLB1 via the fourth contact plug CP4, whereas the fourth source/drain SD4 of the second column select transistor CSTR2 may be connected to the input/output line bar IOLB via the fifth contact plug CP5 smaller than the fourth contact plug CP4.

The eighth source/drain SD8 of the fourth column select transistor CSTR4 may be formed in a same region in which the fourth source/drain SD4 of the second column select transistor CSTR2 is formed. Therefore, the seventh source/drain SD7 of the fourth column select transistor CSTR4 may be connected to the second bit line bar BLB2 via the sixth contact plug CP6, whereas the eighth source/drain SD8 of the fourth column select transistor CSTR4 may be connected to the input/output line bar IOLB via the fifth contact plug CP5 smaller than the sixth contact plug CP6.

Figure 20:
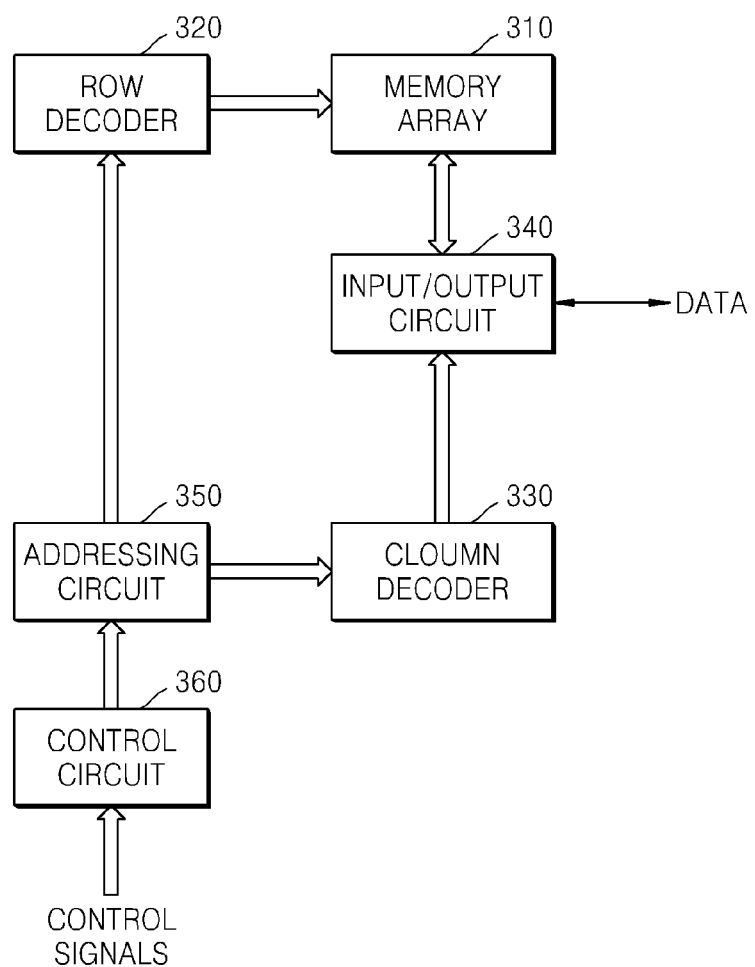
FIG. 20 is an exemplary schematic block diagram of a memory device according to certain embodiments.

FIG. 20 is an exemplary schematic block diagram of a memory device according to certain embodiments.

Referring to FIG. 20, a semiconductor memory device may include a memory array 310, a row decoder 320, a column decoder 330, an input/output circuit 340, an addressing circuit 350, and a control circuit 360.

Since the memory array 310 is same as the memory array shown in FIG. 1 and FIG. 18, any repeated description thereof will be omitted.

The row decoder 320 may receive a row address output by the addressing circuit 350, decode the received row address, and select one or more word lines from among the plurality of word lines. The column decoder 330 may receive a column address output by the addressing circuit 350, decode the received column address, and select one or more bit lines from among the plurality of bit lines.

The input/output circuit 340 may write data to at least one memory cell selected by the row decoder 320 and the column decoder 330. Furthermore, the input/output circuit 340 may read out data stored in at least one memory cell selected by the row decoder 320 and the column decoder 330. The input/output circuit 340 may include the input/output circuit (340 of FIG. 18) shown in FIG. 18. Furthermore, the input/output circuit 340 may include a plurality of detecting/amplifying circuits (not shown) for detecting and amplifying data read out during a reading operation and one or more output drivers (not shown) for driving data written during a writing operation.

The addressing circuit 350 may generate a row address and a column address under the control of the control circuit 360. The control circuit 360 may generate a plurality of operation control signals for controlling operation of the addressing circuit 350 in response to a plurality of control signals that are necessary for performing a writing operation or a reading operation.

Figure 21:
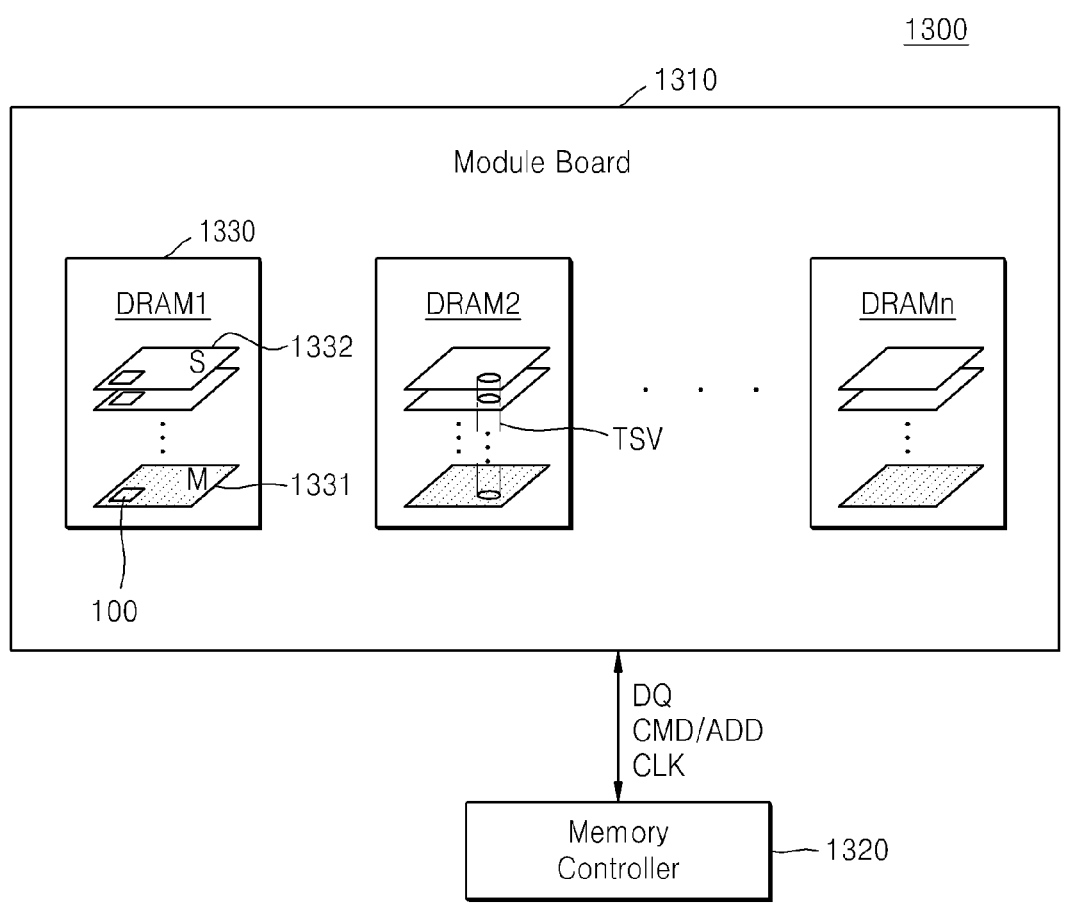
FIG. 21 shows an example of a memory system to which the semiconductor memory device of FIG. 20 is applied, according to certain embodiments.

FIG. 21 shows an example memory system 1300 to which the semiconductor memory device of FIG. 20 is applied, according to certain embodiments.

Referring to FIG. 21, the memory system 1300 may include a memory module 1310 and a memory controller 1320. The memory module 1310 may include at least one semiconductor memory device 1330 mounted on a module board. The semiconductor memory device 1330 may be embodied as a DRAM chip, and the semiconductor memory device 1330 may include a plurality of semiconductor layers. The semiconductor layers may include one or more master chips 1331 and one or more slave chips 1332. Signals may be transmitted between semiconductor layers via a through substrate via (TSV, e.g., through silicon via). The master chip 1331 and the slave chip 1332 may include the memory arrays (310 of FIG. 18) and input/output circuits (340 of FIG. 18), according to embodiments disclosed above. Furthermore, the master chip 1331 and the slave chip 1332 may further include a test circuit.

The memory module 1310 may communicate with the memory controller 1320 via a system bus. Data DQ, commands/addresses CMD/ADD, and clock signals CLK may be transmitted and received between the memory module 1310 and the memory controller 1320 via the system bus.

Figure 22:
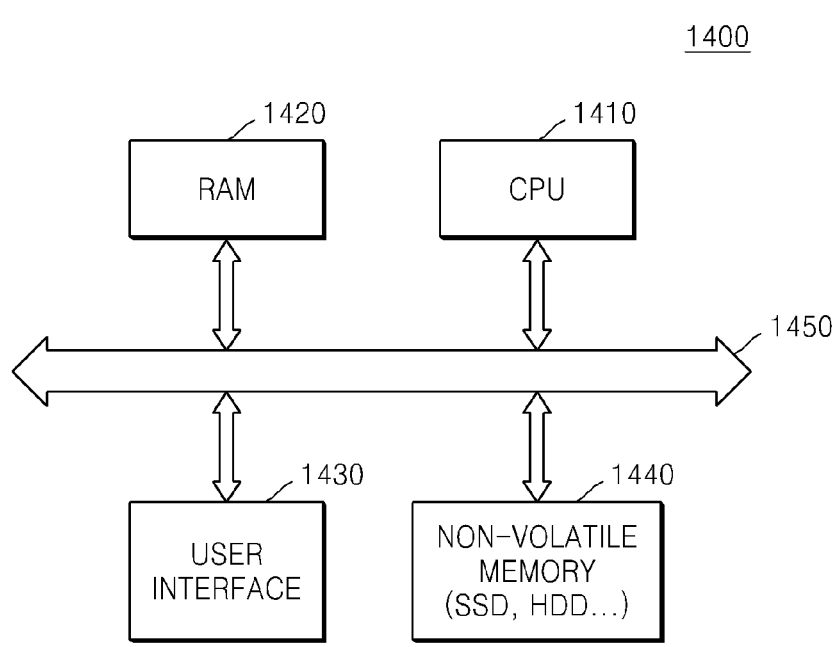
FIG. 22 is an exemplary block diagram of a computing system employing a memory system according to certain embodiments.

FIG. 22 is an exemplary block diagram of a computing system employing a memory system according to certain embodiments.

Referring to FIG. 22, a semiconductor memory device according to the embodiments disclosed above may be mounted on a computing system 1400, such as a mobile device or a desktop computer, as a RAM 1420.

The RAM 1420 may be mounted as the semiconductor memory device according to any of the embodiments described above. For example, the RAM 1420 may be the semiconductor memory device according to one of the embodiments described above or may be applied in the form of a memory module. Furthermore, the RAM 1420 may include a semiconductor memory device and a memory controller.

The computing system 1400 according to one embodiment may include a CPU 1410, the RAM 1420, a user interface 1430, and a non-volatile memory 1440, where the components of the computing device 1400 are electrically connected to a bus 1450. The non-volatile memory 1440 may be a large-capacity storage device, such as a SSD or a HDD.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this disclosure as defined in the claims. In the claims, means-plus-function clauses are intended to cover the structures described herein as performing the recited function, and not only structural equivalents but also equivalent structures.

What is claimed is:

1. A semiconductor memory device comprising:
   a bit line connected to a memory cell;
   an input/output line configured to input a data signal to the memory cell during a writing operation and to output a data signal stored in the memory cell during a reading operation; and
   a column select transistor comprising a first source/drain connected to the bit line and a second source/drain connected to the input/output line,
   wherein a resistance of the first source/drain is smaller than a resistance of the second source/drain.

2. The semiconductor memory device of claim 1, wherein the column select transistor is configured such that a first current flows during the writing operation and a second current flows during the reading operation, and
   wherein the first current is larger than the second current.

3. The semiconductor memory device of claim 1, wherein doping profiles of the first source/drain and the second source/drain are different from each other.

4. The semiconductor memory device of claim 3, wherein doping concentration of the first source/drain is higher than that of the second source/drain.

5. The semiconductor memory device of claim 3, wherein the first source/drain comprises M regions selected from among a lightly doped drain (LDD) region, a halo doped region, and a source/drain doped region,
   wherein the second source/drain comprises N regions selected from among a LDD region, a halo doped region, and a source/drain doped region, and
   wherein M is greater than N.

6. The semiconductor memory device of claim 3, wherein the first source/drain comprises a highly doped source/drain region and M regions selected from between a lightly doped drain (LDD) region and a halo doped region,
   wherein the second source/drain comprises a lightly doped source/drain region and N regions selected from between a LDD region and a halo doped region, and
   wherein M is equal to or greater than N.

7. The semiconductor memory device of claim 3, wherein the first source/drain comprises a highly doped plug doping region, and
   wherein the second source/drain comprises either no plug doping region or a lightly doped plug doping region.

8. The semiconductor memory device of claim 1, further comprising:
   a first contact plug connected to the first source/drain; and
   a second contact plug connected to the second source/drain,
   wherein a first occupying ratio of the first contact plug with respect to the first source/drain is greater than a second occupying ratio of the second contact plug with respect to the second source/drain.

9. The semiconductor memory device of claim 8, wherein an area of the first source/drain is smaller than an area of the second source/drain.

10. The semiconductor memory device of claim 8, wherein an area of the first contact plug is larger than an area of the second contact plug.

11. A semiconductor memory device comprising:
    a bit line connected to a memory cell;
    an input/output line configured to input a data signal to the memory cell during a writing operation and to output a data signal stored in the memory cell during a reading operation; and
    a transistor including a first node connected to the bit line and a second node connected to the input/output line,
    wherein the first and second nodes are part of the transistor, and
    wherein a first resistance of the first node is smaller than a second resistance of the second node.

12. The semiconductor memory device of claim 11, wherein the transistor is configured such that a first current flows during the writing operation and a second current flows during the reading operation, and
    wherein the first current is larger than the second current.

13. A memory device comprising:
    a bit line connected to a memory cell;
    an input/output line configured to write data to the memory cell during a writing operation and to read data from the memory cell during a reading operation; and
    a transistor having a first source/drain connected to the bit line and a second source/drain connected to the input/output line,
    wherein the transistor is configured such that a first current flows from the input/output line to the bit line during the writing operation, and a second current smaller than the first current flows from the bit line to the input/output line during the reading operation.

14. The memory device of claim 13, wherein a first resistance of the first source/drain is smaller than a second resistance of the second source/drain.

15. The memory device of claim 13, further comprising:
a first contact plug contacting the bit line and the first source/drain;
a second contact plug contacting the input/output line and the second source/drain; and
a read/write circuit connected to the input/output line and configured to read data from the memory cell during the reading operation and to write data to the memory cell during the writing operation,
wherein an area of the first contact plug with respect to an area of the first source/drain is larger than an area of the second contact plug with respect to an area of the second source/drain.

16. The memory device of claim 13, further comprising:
a first contact plug contacting the bit line and the first source/drain;
a second contact plug contacting the input/output line and the second source/drain; and
a read/write circuit connected to the input/output line and configured to read data from the memory cell during the reading operation and to write data to the memory cell during the writing operation,
wherein a first occupying ratio of the first contact plug with respect to the first source/drain is greater than a second occupying ratio of the second contact plug with respect to the second source/drain.

17. The memory device of claim 13, wherein a doping profile of the first source/drain is different from a doping profile of the second source/drain.

18. The memory device of claim 17, wherein the first source/drain includes m doping regions and the second source/drain includes n doping regions, and
wherein m is greater than n.

19. The memory device of claim 13, wherein the first source/drain includes a plug doping region and the second source/drain does not include plug doping region.

20. The memory device of claim 13, wherein a doping concentration of the first source/drain is higher than a doping concentration of the second source/drain.

* * * * *